United States Patent
Barqueros et al.

(10) Patent No.: US 10,631,414 B2
(45) Date of Patent: Apr. 21, 2020

(54) METHOD FOR PLACING AN SMD SEMICONDUCTOR LIGHT SOURCE COMPONENT OF AN ILLUMINATION DEVICE FOR A MOTOR VEHICLE

(71) Applicant: Automotive Lighting Reutlingen GmbH, Reutlingen (DE)

(72) Inventors: Narcis Barqueros, Sabadell (ES); Martin Gottheil, Kusterdingen (DE); Michael Hiegler, Reutlingen (DE); Uwe Bormann, Heidenheim (DE)

(73) Assignee: Automotive Lighting Reutlingen GmbH, Reutlingen (DE)

( * ) Notice: Subject to any disclaimer, the term of this patent is extended or adjusted under 35 U.S.C. 154(b) by 341 days.

(21) Appl. No.: 15/543,652

(22) PCT Filed: Jan. 11, 2016

(86) PCT No.: PCT/EP2016/050390
§ 371 (c)(1),
(2) Date: Jul. 14, 2017

(87) PCT Pub. No.: WO2016/113225
PCT Pub. Date: Jul. 21, 2016

(65) Prior Publication Data
US 2018/0242461 A1 Aug. 23, 2018

(30) Foreign Application Priority Data
Jan. 14, 2015 (DE) .................. 10 2015 200 393

(51) Int. Cl.
*H05K 3/30* (2006.01)
*H05K 3/34* (2006.01)
(Continued)

(52) U.S. Cl.
CPC ........... *H05K 3/305* (2013.01); *B23K 1/0016* (2013.01); *F21S 41/141* (2018.01); *F21S 41/19* (2018.01);
(Continued)

(58) Field of Classification Search
CPC ........ H05K 3/305; H05K 1/181; H05K 3/341; H05K 2201/10106; H05K 2201/10121;
(Continued)

(56) References Cited

U.S. PATENT DOCUMENTS 5,680,698 A  10/1997 Armington et al.
6,266,891 B1 * 7/2001 Yamamoto ........ H01L 21/67144
                                                  33/286
(Continued)

FOREIGN PATENT DOCUMENTS

AT         513747 A4   7/2014
DE    102007049310 A1  4/2009
(Continued)

OTHER PUBLICATIONS

Examination Report issued for German Patent Application No. 10 2015 200 393.0 dated Sep. 23, 2015 (7 pages).
(Continued)

*Primary Examiner* — Donghai D Nguyen
(74) *Attorney, Agent, or Firm* — Howard & Howard Attorneys PLLC (57) ABSTRACT

A method for placing an SMD semiconductor light source component and a component of an illumination device for a motor vehicle. The SMD semiconductor light source component is operated so as to generate light, and the emission characteristics of the SMD semiconductor light source component are determined. In a subsequent step, the SMD
(Continued)

semiconductor light source component and the component are positioned relative to one another in accordance with the emission characteristics.

12 Claims, 10 Drawing Sheets

(51) Int. Cl.

| | | |
|---|---|---|
| *F21S 41/19* | (2018.01) | |
| *F21S 41/141* | (2018.01) | |
| *F21S 41/20* | (2018.01) | |
| B23K 1/00 | (2006.01) | |
| H05K 1/18 | (2006.01) | |
| *H05K 1/02* | (2006.01) | |
| *F21Y 115/10* | (2016.01) | |
| *B23K 101/40* | (2006.01) | |

(52) U.S. Cl.
CPC ............ *F21S 41/285* (2018.01); H05K 1/181 (2013.01); H05K 3/303 (2013.01); H05K 3/341 (2013.01); *B23K 2101/40* (2018.08); *F21Y 2115/10* (2016.08); *H05K 1/0269* (2013.01); *H05K 2201/10106* (2013.01); *H05K 2201/10121* (2013.01); *H05K 2203/166* (2013.01); *Y02P 70/613* (2015.11)

(58) Field of Classification Search
CPC ............ H05K 2203/166; H05K 3/303; H05K 1/0269; B23K 1/0016; F21S 41/19; F21S 41/141; F21S 41/285; Y10T 29/49131; Y10T 29/49144

USPC ............................................ 29/832–834, 840
See application file for complete search history.

(56) References Cited

U.S. PATENT DOCUMENTS

| | | | |
|---|---|---|---|
| 9,220,166 B2 * | 12/2015 | Lai ...................... | H05K 1/0292 |
| 10,217,675 B2 * | 2/2019 | Karch ................. | H05K 1/0269 |
| 2002/0027650 A1 | 3/2002 | Yamamoto et al. | |
| 2009/0096341 A1 | 4/2009 | Dobler et al. | |
| 2014/0173884 A1 | 6/2014 | Lai | |
| 2014/0173885 A1 | 6/2014 | Lai | |
| 2015/0364384 A1 | 12/2015 | Karch | |

FOREIGN PATENT DOCUMENTS

| | | |
|---|---|---|
| DE | 102013221644 A1 | 10/2014 |
| DE | 212014000002 U1 | 11/2014 |

OTHER PUBLICATIONS

International Search Report and Written Opinion of the International Searching Authority for PCT International Application No. PCT/EP2016/050390 dated Apr. 25, 2016 (21 pages).

* cited by examiner

METHOD FOR PLACING AN SMD SEMICONDUCTOR LIGHT SOURCE COMPONENT OF AN ILLUMINATION DEVICE FOR A MOTOR VEHICLE

CROSS-REFERENCE TO RELATED APPLICATIONS

The present application is a National Phase of International Patent Application No. PCT/EP2016/050390, filed on Jan. 11, 2016, which claims priority to and all the benefits of German Patent Application No. 10 2015 200 393.0, filed, on Jan. 14, 2015, both of which are hereby expressly incorporated herein by reference its their entirety.

BACKGROUND OF THE INVENTION

1. Field of the Invention

The invention relates to a method for placing an SMD semiconductor light source component of an illumination device for a motor vehicle.

2. Description of the Related Art

DE 10 2007 049 310 A1 discloses that it is important to ensure that a desired position of semiconductor light sources should be precisely defined and statically secured relative to a reflector.

In addition, it is known that SMD semiconductor light source components have specific tolerances relative to the light output area. At the same time, safety-related and optical requirements are placed on illumination, devices for motor vehicles. For example, in a headlight of a motor vehicle, a cut-off line mast be safely maintained to avoid dazzling oncoming traffic.

It is also known that SMD components and thus also SMD semiconductor light source components can become blurred in the process of reflow soldering. This results in a further disturbance variable when placing an SMD semiconductor light source component on a circuit board.

The publication AT 513747 A4 discloses a method of optically detecting a position of a light-emitting area of an SMD LED. The SMD LED is mounted on a circuit carrier in accordance with the detected position of the light-emitting area.

Therefore, the invention has the object of providing a more precise arrangement of SMD semiconductor light source components relative to additional components of an illumination device of a motor vehicle so as to improve the reproduction of the light emitted by the SMD semiconductor light source component.

SUMMARY OF THE INVENTION

The object on which the invention is based is achieved by the method described in the claims. Furthermore, important characteristics of the invention are disclosed in the subsequent description and the drawings, wherein the characteristics can be important, for the invention on an individual basis or in different combinations without requiring a specific reference.

The SMD semiconductor light source component is operated so as to generate light, and the emission characteristics of the SMD semiconductor light source component are determined. In a subsequent step, the SMD semiconductor light source component and the component are positioned relative to one another in accordance with the emission characteristics. This results in an obvious benefit for an arrangement precision. The proposed method can also compensate the shifting of a phosphorous area of the SMD semiconductor light source component, because the operated SMD semiconductor light source component is measured and a light profile is formed. In particular, the measurement of the operated and thus luminous SMD semiconductor light source component makes it possible to better evaluate the resulting emission characteristics of the entire illumination device.

In contrast with the device disclosed in publication AT 513747 A4, the SMD semiconductor light source component is not mounted on a circuit board in accordance with a detected position of the light-emitting area. Instead, the SMD semiconductor light source component is operated so as to generate light and the emission characteristics of each individual luminous SMD semiconductor light source component are determined. The SMD semiconductor light source component and a component are positioned relative to one another in accordance with the individually determined emission characteristics. In contrast with the method proposed in AT 513747 A4, it is thus advantageously achieved that the relevant activated condition of the SMD semiconductor light source component is taken into consideration when positioned on the circuit board. As a result, the light emitted by the SMD semiconductor light source is presently reproduced more accurate and precise than it would be possible with an illumination device according to AT 513747 A4.

It is proposed that an intensity distribution of the light emitted from the luminous area of the SMD LED is determined over the entire area. The intensity distribution is completely independent from the geometric properties of the luminous area. For example, an intensity maximum can be formed in the center of the luminous area or laterally offset in relation to the center. Therefore, the method known from AT 513747 A4 can be only performed with precise geometrical positioning of the luminous area of an SMD LED relative to a component of the semiconductor light source component, for example, a lens or optical head. AT 513747 A4 is not able to take into account the actual lighting properties of the SMD LED, for example, an actual intensity distribution over the entire luminous area. This is only possible by using the present invention. Because of the fact that the resulting light distribution of the semiconductor light source component is determined by the orientation of the intensity distribution of the luminous area, it is possible to achieve a more precise light distribution using the present invention.

In one advantageous embodiment, the component comprises a circuit board. In the third step, the SMD semiconductor light source component and the electrical component are positioned relative to one another and connected with one another. In the case of a circuit board, a contact of the SMD semiconductor light source component takes place and the precise positioning is advantageously established with a contacting step of the electrical connections.

In one advantageous embodiment, the light profile is determined in the second step relative to the respective SMD semiconductor light source component, in particular relative to an outer edge of the SMD semiconductor light source component and/or relative to an outer edge of the light-emitting area. As a result, a gripper of a placement machine can advantageously only receive at the housing of the SMD semiconductor light source component and position at the target position in accordance with the light profile.

In one advantageous embodiment, the light profile is determined relative to the circuit board, in particular, relative to centering holes in the circuit board.

In one advantageous embodiment the connection of the SMD semiconductor light source component comprises a first connection step and a second connection step. The first connection step comprises a fixation, especially with the use of an adhesive, of the SMD semiconductor light source component relative to the circuit, board. Instead of using an adhesive, it is also possible to form a different temporary connection between SMD semiconductor light source component and circuit board. The second connection step comprises the electrical and form-fit connection between the SMD semiconductor light source component and the circuit board, formed especially with the use of a reflow soldering process. It is certainly also possible to use a different soldering and connection process, which substitutes or supplements the fixation from the first connection step. In this way, it is possible to transfer in an advantageous manner the precision of positioning the SMD semiconductor light source component achieved by the previous steps to the form-lit connection between circuit board and SMD semiconductor light source component.

In one advantageous embodiment, the component comprises an optical component, for example, a reflector, an optical head or a screen. Advantageously, the light profile of the SMD semiconductor light source component can be used to adjust the optical components relative to the SMD semiconductor light source components placed already on a circuit board, which has a direct effect on the emission characteristics of the entire illumination device.

In one advantageous embodiment, the SMD semiconductor light source component is placed in the first step on a circuit board. In the third step, the circuit board and the optical components of the illumination device are positioned relative to one another and connected to one another. As a result, the light profile is advantageously used for arranging the circuit board and the optical component relative to one another and thus also for arranging the SMD semiconductor light source component relative to the optical component. Furthermore, in a fourth step, the SMD semiconductor light source component is operated so as to generate light. In a fifth step, a further light profile of the luminous SMD semiconductor light source component is determined. In a sixth step, the SMD semiconductor light source component is positioned in relation to the circuit board and connected with the circuit board in accordance with the determined further light profile. The fourth, fifth and sixth step are performed in this sequence prior to the first step. Advantageously, this results in a two-stage placement of the SMD semiconductor light source component. In the first stage, the SMD semiconductor light source component is connected, with the circuit board according to the fourth, fifth and sixth step. Advantageously, in the subsequent first, second and third steps, the circuit board together with the SMD semiconductor light source component is adjusted relative to the optical component and connected with the optical component. Advantageously, this makes it possible to ensure even more precise arrangements of the SMD semiconductor light source component. Moreover, this measure represents a further quality assurance when using SMD semiconductor light source components in illumination devices for motor vehicles.

In one advantageous embodiment in the second and/or fifth step, the light profile of the SMD semiconductor light source component is applied to the circuit board. Advantageously, this results in a detachment of the processing stations. Furthermore, the light profile can be used for quality assurance purposes, for example, in the form of encoding the circuit board.

In one advantageous embodiment of the method, a number of SMD semiconductor light sources are operated in the first and/or fourth step. In the second and/or fifth step, a light profile of the number of SMD semiconductor light source components is determined. Therefore, the method can be advantageously also used for a number of SMD semiconductor light sources.

In one advantageous embodiment, the light profile comprises a main light output. In the third and/or sixth step, the main light output of the SMD semiconductor light source component is positioned via a target coordinate on the electrical, and/or intermediate component. Advantageously, this makes it possible to implement an even light distribution, especially when SMD semiconductor light source components are operated simultaneously.

In one advantageous embodiment, the light profile comprises an edge. In the third and/or sixth step, the SMD semiconductor light source component is rotated about a torsion angle determined in accordance with the edge (40) and a target, line and positioned relative to the electrical and/or optical component. For example, the target line is a straight, which represents the cut-off line for the illumination device. Advantageously, the cut-offline for the respective headlight can be more precisely maintained because, resulting from the contortion, the edge extends basically parallel, to the target line.

Further characteristics, possibilities of use and advantages of the invention are included in the subsequent description of embodiments of the invention, which are depicted in the figures of the drawing. At the same time, all characteristics described or depicted form on an individual basis or in different combinations the subject matter of the invention, independent of their compilation in the claims or any references and independent, of their wording or representation in the drawing. In all figures, the same reference numerals are used for functionally equivalent variables and characteristics, even if they apply to different embodiments.

BRIEF DESCRIPTION OF THE DRAWINGS

Other advantages of the invention will be readily appreciated as the same becomes better understood by reference to the following detailed description when considered in connection with the accompanying drawings, wherein.

DETAILED DESCRIPTION OF THE INVENTION

Figure 1:
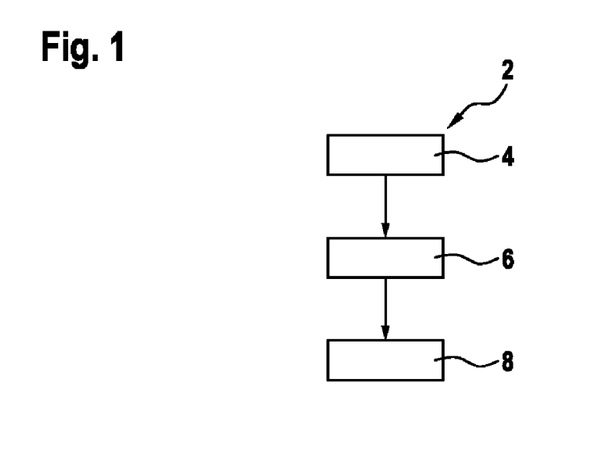
FIG. 1 is a schematic flow diagram.

FIG. 1 is a schematic flow diagram 2. In a first step 4, an SMD semiconductor light source component is operated so as to generate light, and emission characteristics of the SMD semiconductor light source component are determined. For example, to be operated, the SMD semiconductor light source component can be placed by the reception device of a placement machine on a test board. On the test board, the SMD semiconductor light source component is operated so as to generate light and receive the emission characteristics. In a second step 6, a light profile of the luminous SMD semiconductor light source component is determined m accordance with the emission characteristics. In a third step 8, the SMD semiconductor light source component and a component of an illumination device for a motor vehicle are positioned relative to one another and connected with one another in accordance with the light profile.

As an alternative to providing the previously mentioned test board, the SMD semiconductor light source component can also be placed on the circuit board by any suitable connection mechanism, for example, an adhesive, and operated there. In accordance with the determined light profile, it is possible to perform a correction of the SMD semiconductor light source component already placed on the circuit board, which comprises, for example, a contortion of the SMD semiconductor light source component prior to the appropriate soldering process. But it is also possible that the light profile is provided for subsequent process steps, for example, by applying the light profile in the form of encoding the circuit board, either for the purpose of eliminating the respective board or otherwise compensating a deviation of the actual light profile from a target light profile.

Figure 2:
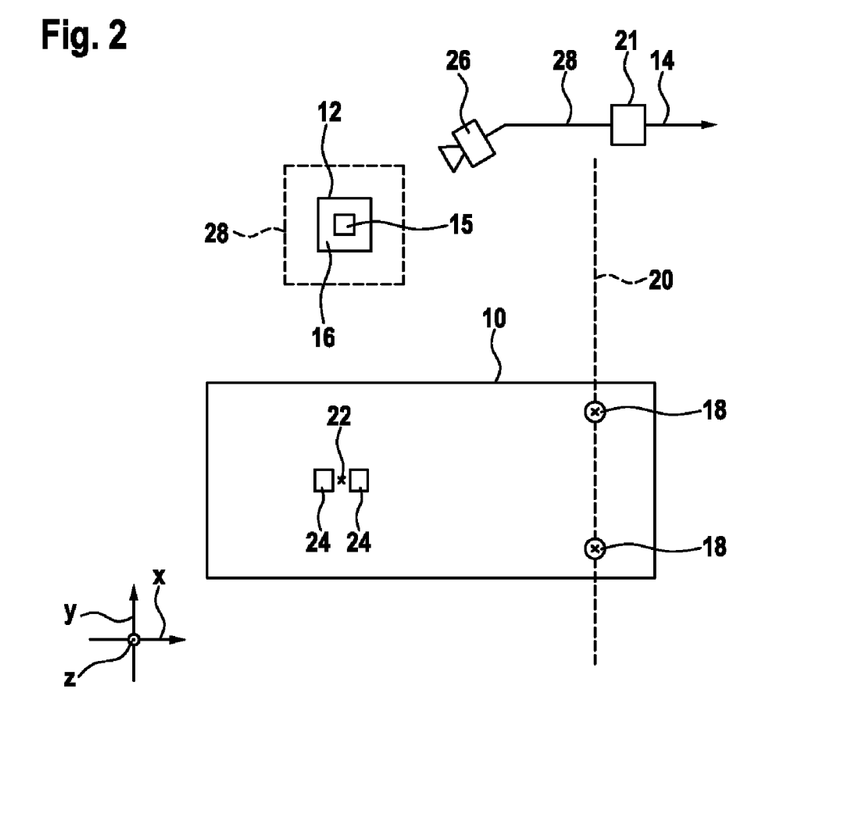
FIG. 2 is a schematic top view on a circuit board.

FIG. 2 is a schematic top view on a circuit board 10. Furthermore, it shows the SMD semiconductor light source component 12, which has a light-emitting area 15 and an edge region 16. The outer contours of the SMD semiconductor light source component 12 and the light-emitting area 15 basically show a square configuration, but they can certainly comprise any other rectangular or different geometric form. The light-emitting area 15 is defined by a light profile 14 determined using a block 21, which results in a more precise placement of the SMD semiconductor fight source component 12. In a state of operation, the light-emitting area 15 comprises the light profile 14, which can differ from the light-emitting area 15 relative to the outer contours, as well as relative to a desired light distribution over the surface of the light-emitting area 15. Therefore, the light-emitting area 15 does not necessarily correspond to an area 15 on the SMD semiconductor light source component 12, which is visible in the state of non-operation, or in a non-luminous state of the SMD semiconductor light source component 12, and which is provided for generating light, but can differ from it.

For example, the circuit board 10 comprises centering holes 18, which have a straight 20 extend through their centers. For example, both centers of the centering holes 18 or the straight 20 are used as reference for positioning the SMD semiconductor light source component 12. For example, by means of the centering holes 18, a target coordinate 22 can be indicated or calculated in the area of contacts 24, wherein the contacts 24 are provided to form a connection with the SMD semiconductor light source component 12 by an appropriate soldering process, which produces an electrical connection between the circuit board 10 and the SMD semiconductor light source component 12.

Emission characteristics 28 of the activated SMD semiconductor light source component 12 are recorded by a recording camera 26, wherein the emission characteristics 28 are basically formed by light intensity values of a recorded digital Image. Therefore, the emission characteristics 28 are also described as intensity distribution. The camera 26 is arranged in such a way that the emission characteristics 28 can be recorded in a coordinate system relative to the circuit board 10. Alternatively, the emission characteristics 28 can also be recorded relative to the contours of the SMD semiconductor light source component 12. By means of the emission characteristics 28, the light profile 14 is determined using the evaluation block 21. The camera 26, or the associated camera system comprises a high dynamic range, thus making it possible to detect especially the differences in brightness at the edges of the light-emitting area 15. For this purpose, the camera system can be designed in such a way that several pictures can be taken using different exposure times and/or different optical heads, for example, optical attenuators using consistent positions of camera 26 and SMD semiconductor light source component 12, which are subsequently superimposed or combined with the emission characteristics 28. It also provides the possibility of taking a picture of the SMD semiconductor light source component 12, which puts the emission characteristics 28 in relation to the outer contours of the SMD semiconductor light source component 12. As a result, the emission characteristics 28 in the form of a digital image can also comprise the outer contours of the SMD semiconductor light source component 12. The light profile 14 characterizes the position of the light actually emitted by the SMD semiconductor light source component 12 during operation relative to the light-emitting area 15, relative to the SMD semiconductor light source component 12 or relative to the circuit board 10.

Figure 3A:
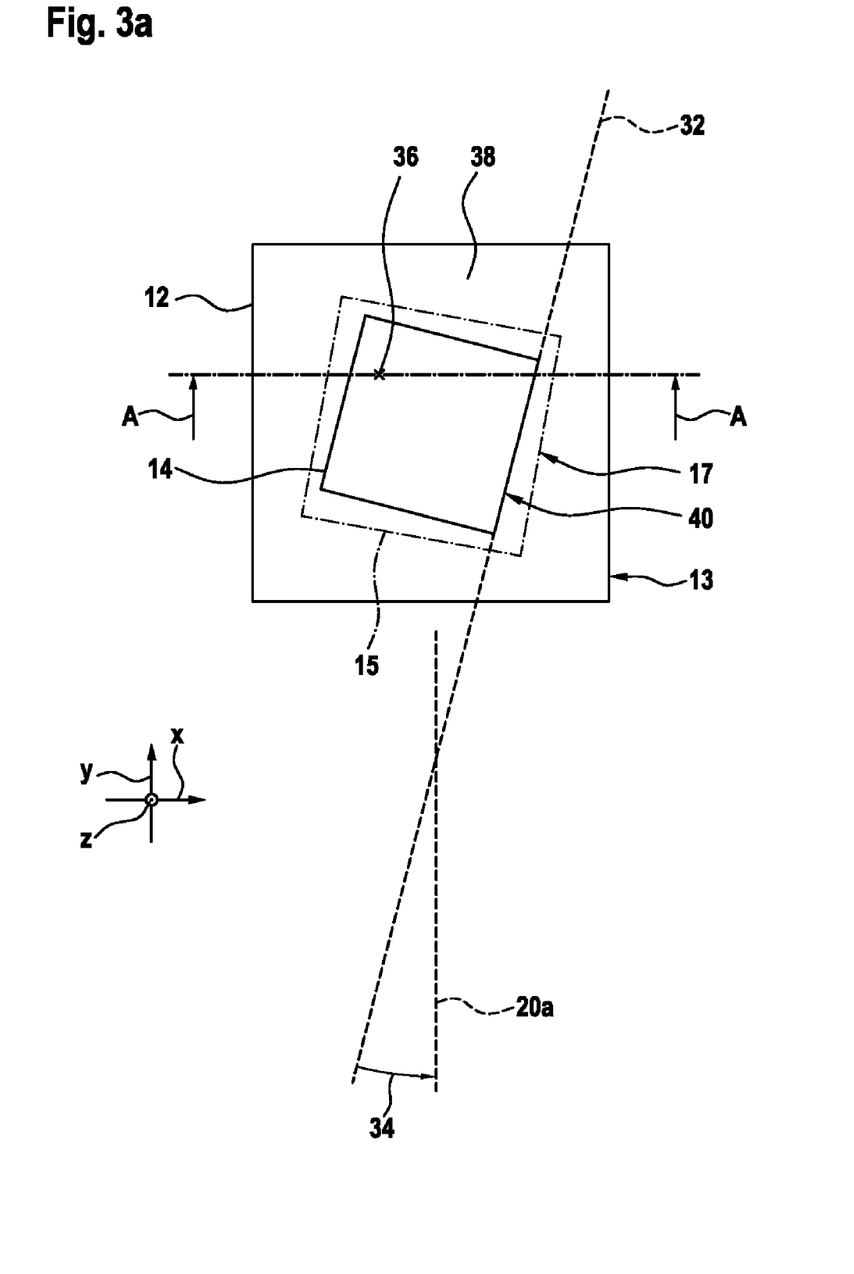
FIG. 3a is a schematic top view on an SMD semiconductor light source component.

FIG. 3a shows a schematic top view on the SMD semiconductor light source component 12 with the position of the light profile 14. The light profile 14 is distorted relative to an outer contour of the SMD semiconductor light source component 12 in an xy-plane, as well as relative to a parallel 20a of the straight shown in FIG. 2. In particular, an edge 40 of the light profile 14 arranged in positive x-direction is distorted relative to the outer contour of the SMD semiconductor light source component 12, especially to an outer edge 13 of the SMD semiconductor light source component 12, as well as relative to a parallel 20a, which represents a target light profile. The edge 40 can also be distorted relative to an outer edge 17 of the light-emitting area 15. In a different example, edge 40 can be parallel to a respective edge 13 of the outer contour, but the SMD semiconductor light source component 12 is distorted at its placement position so as to determine the light profile 14 relative to the parallel 20a, whereby also the edge 40 is distorted relative to the parallel 20a.

The target light profile for placing the SMD semiconductor light source component 12 and the components 10, 42 is predetermined. In the third step 8, the SMD semiconductor light source component 12 and the components 10, 42 are positioned relative to one another in accordance with a comparison of the actual light profile and the target, light profile. For example, the comparison of the determined actual light profile 14 and the target light profile can result in a displacement vector and/or torsion angle, about which the SMD semiconductor light source component 12 is displaced and/or distorted relative to the components 10, 42.

In summary, a respective light profile 14 is determined from measured emission characteristics 28 of an operated SMD semiconductor light source component 12. For example, in a particular embodiment, the light profile 14 can comprise only the position of the edge 40. In a different embodiment, the light profile 14 can comprise only the position of the main light output 36, hi a further embodiment, the light profile 14 can comprise the position, of the main light output 36 and the position of the edge 40. In a further embodiment, the light profile 14 comprises additional coordinates or vectors, which characterize the emission characteristics 28 of the SMD semiconductor light source component 12 and which can be determined, among other things, from, the emission characteristics 28.

For example, the parallel 20*a* and the straight 20 indicate an adjustment of the cut-off line for a motor vehicle headlight relative to the circuit board 10. It is certainly also possible to choose a different adjustment of the respective straight 20*a* for the cut-off line. Therefore, the edge 40 must be adjusted as parallel as possible relative to the straight 20*a*. In the emission characteristics 28 shown in FIG. 2, the position of at least one edge 40 in the form of a straight 32 can be recognized. Correspondingly, a torsion angle 34 is produced between straight 32 and straight 20*a*.

Because of the fact that the SMD semiconductor light source component 12 is operated when the emission characteristics 28 are received, or light is emitted, it is also possible to determine from the emission characteristics 28 a distribution of the luminosity within the light profile 14, instead of the edge 40 of the light profile 14. As a result, a main light output 36 can be determined, which characterizes the distribution of the luminosity. The main light output 36 is described by an xy-coordinate.

For example, the main light output 36 can be determined in that the emission characteristics 28 in x-direction is evaluated in the area of the light profile 14, that in x-direction a coordinate and a value for the illuminance can be determined line-by-line. For the gaps an analogous procedure is performed and the y-coordinate of the main light output 36 is determined.

It is certainly also possible to transfer the determination of the main light output 36 to different geometric forms of the light profile 14. It is also possible to use different embodiments for determining the main light output 36.

The light profile 14 of one SMD semiconductor light source component 12 and/or multiple SMD semiconductor light source components 12 comprises the edge 40 or the straight 32 and/or the main light output 36. Furthermore, the light profile 14 can comprise further coordinate values such as the coordinates of the end points of the edge 40 and/or further light outputs, which are subordinate to the main light output 36.

Figure 3B:
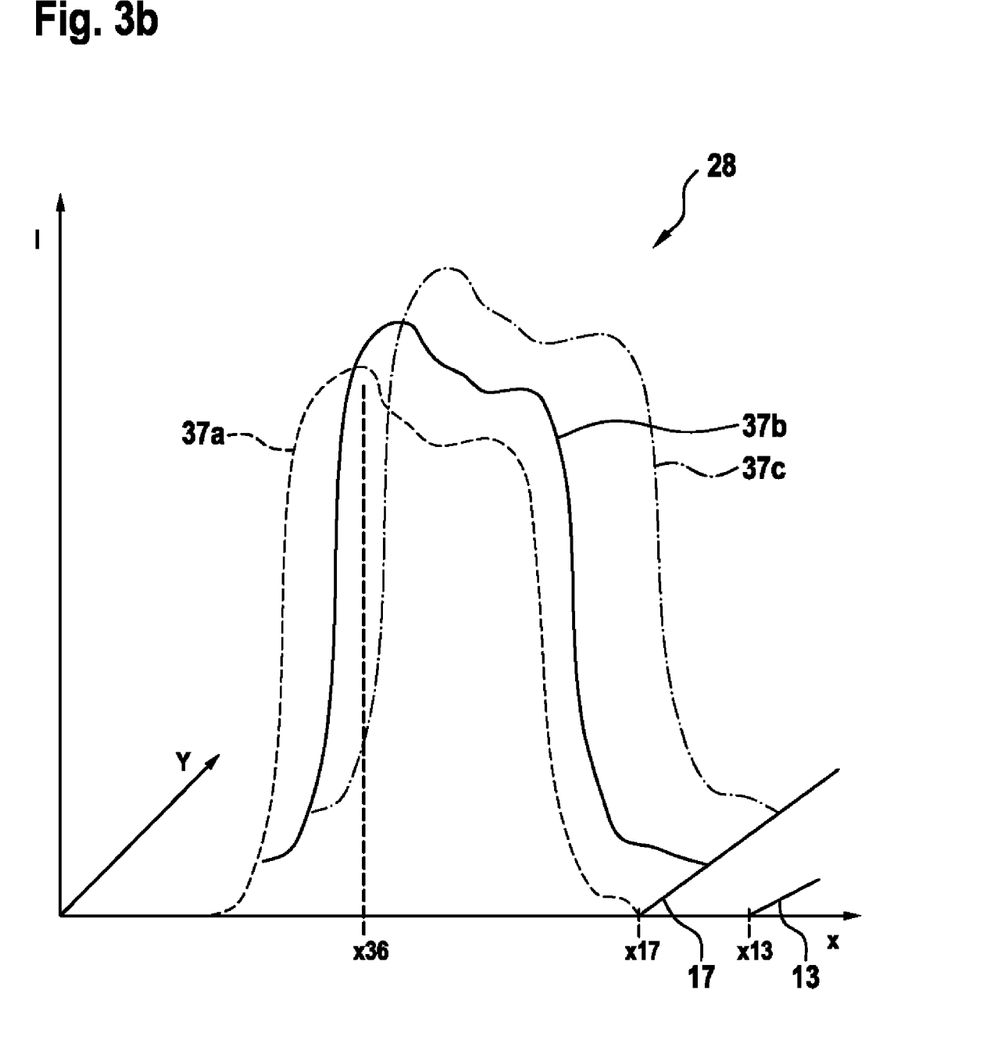
FIG. 3b is a diagram of an intensity profile.

FIG. 3*b* is a diagram of schematically and partially depicted emission characteristics 28, wherein one section A from FIG. 3*a* is represented by a first intensity curve 37*a*. Further intensity curves 37*b* mid 37*c* are shown in an exemplary manner on additional y-coordinates parallel to the x-axis, wherein the intensity curves 37*a*-37*c* originate from an image according to the emission characteristics 28. Therefore, an intensity curve 37 shows the respective intensity value I along or parallel to the x-axis. In particular, the intensity value I comprises a digital value and is here depicted schematically in the form of the intensity curves 37. Furthermore, the edges 17 and 13 are shown with appropriate x-coordinates x17 and x18 on the x-axis.

A coordinate x36 is an x-coordinate of the main light output 36, which here lies in an exemplary manner at the maximum of the intensity curves 37*a*. However, depending on the calculation method, the respective coordinate of the main light output 36 must not necessarily lie at the maximum of the observed section.

Figure 3C:
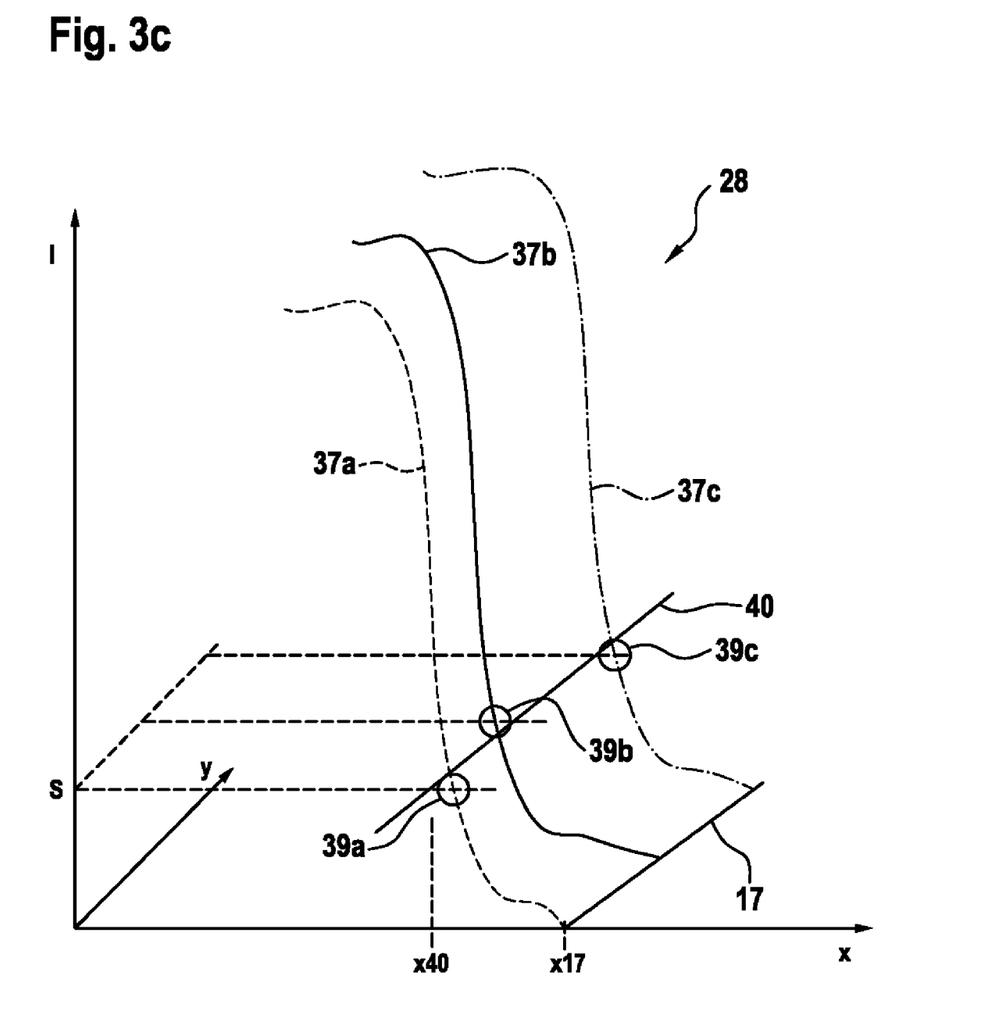
FIG. 3c is another diagram of an intensity profile.

FIG. 3*c* shows a section depicted in FIG. 3*b*. Section A shows an x-coordinate x40 of the edge 40. For example, a coordinate 39 is determined by a specified threshold value S, from which the light intensity I for the cut-offline is effective. Thus, for multiple intensity curves 37, respective coordinates or points 39 are formed as intersection points of a plane, which extends parallel to the xy-plane through the threshold value S. Through this point cloud comprising points 39*a* to 39*c*, a straight is determined on the basis of which the edge 40 is determined.

Figure 3D:
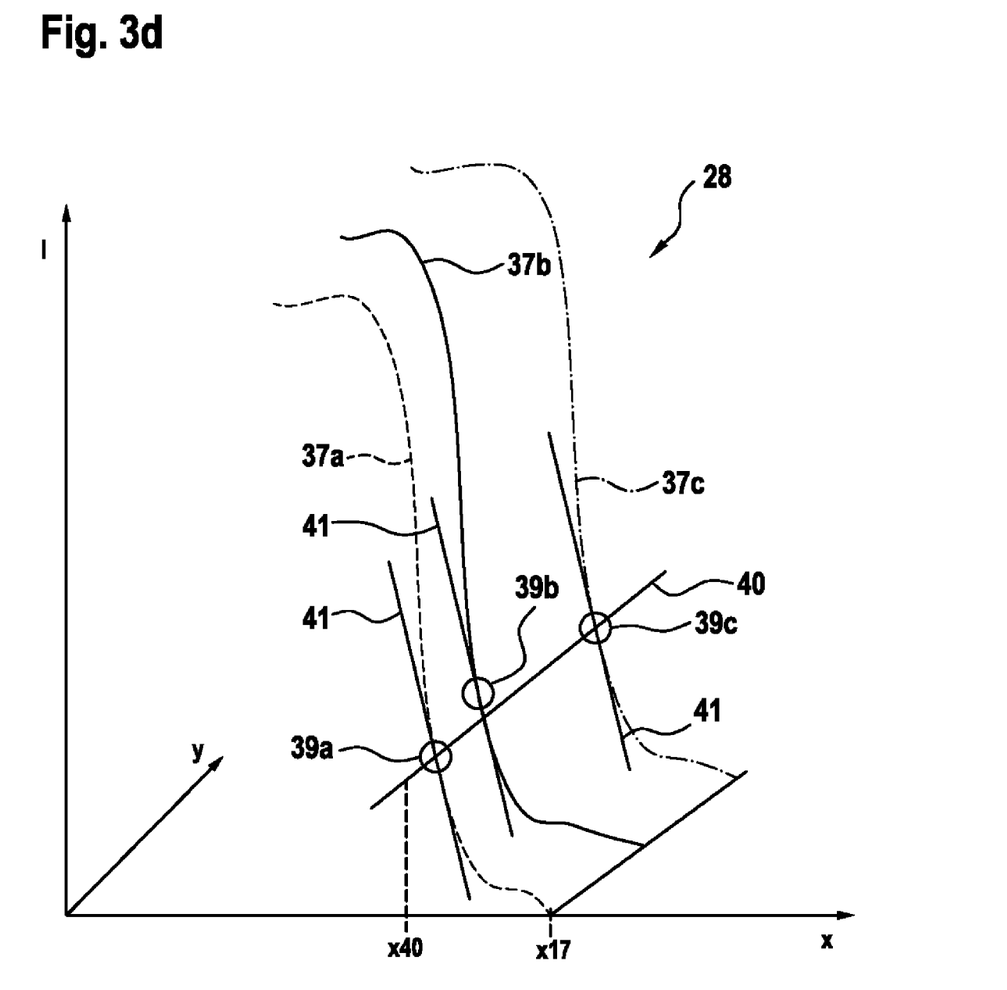
FIG. 3d is a diagram of an intensity profile.

In comparison to FIG. 3*c*, in FIG. 3*d* a further method for determining the points 39 is used. Based on positive x-values, the first deviation is formed at the respective intensity curve 37. If a threshold value for the deviation according to the tangent 41 is achieved, this is where the respective point 39 is positioned. Based on the point cloud comprising points 39*a* to 39*c*, a straight is determined, which then forms the edge 40.

Alternatively to the methods of determining the points 39 described in FIGS. 3*c* and 3*d*, the second deviation of the respective intensity curve 37 can also be taken into consideration. Opposite to the x-direction, the respective point 39 is determined as first occurrence of a turning point, i.e., the second deviation of the intensity curve 37 assumes a value of almost zero. Based on the point cloud comprising the respective points 39, a straight is determined, which then forms the edge 40.

The methods for determining the points 39 can certainly also be connected. For example, as a first condition, the intensity value I for the profile above the threshold value S can be selected, and this first condition can be UND-connected with a second condition, wherein the second condition specifies, for example, the occurrence of a first turning point.

The points 39 can be used as input values for a least mean squares algorithm so as to estimate the edge 40.

Only connections on an x-l-plane are shown for determining the edge 40 or the main light output 36. It is certainly possible to provide further combination operations in the xyl-space, especially regarding the y-axis.

Figure 4:
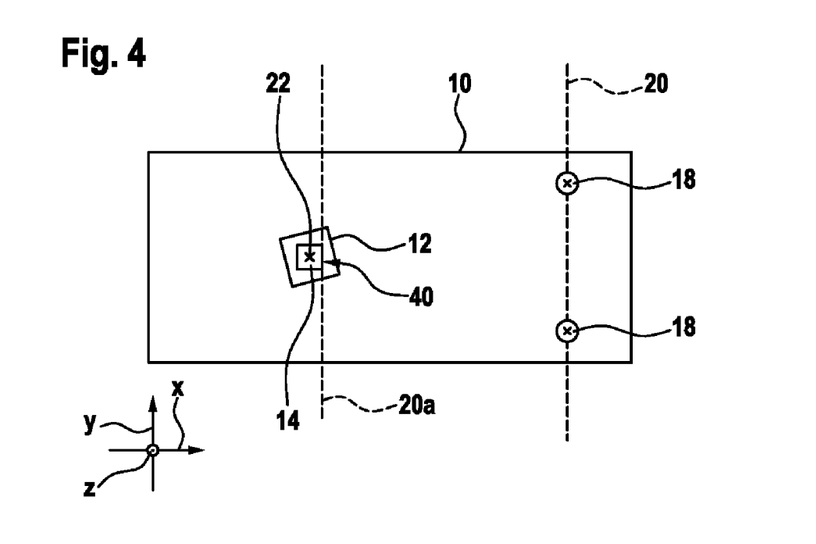
FIG. 4 is another schematic top view on a circuit board.

FIG. 4 is a schematic top view on the circuit board 10. The SMD semiconductor light source component 12 is rotated about the torsion angle 34 and arranged with the center of the light profile 14 above the target coordinate 22.

When placing the SMD semiconductor light source component 12 in accordance with the light profile 14, for example, in accordance with the edge 40 or the main light output 36, it is basically possible to coordinate an optical component, such as a screen, an optical head or the like directly by using the reference holes 18. As a result, the respective semiconductor light source component 12 and the optical component are already adjusted relative to one another.

For example, the arrangement shown in FIG. 4 can be provided to emit the light of the SMD semiconductor light source component 12 in x-direction. As optical component, a parabolic reflector is placed above the SMD semiconductor light source 12 opposite to the z-direction. Accordingly, a light distribution occurs in x-direction, which has a cut-offline specified by the edge 40.

Figure 5:
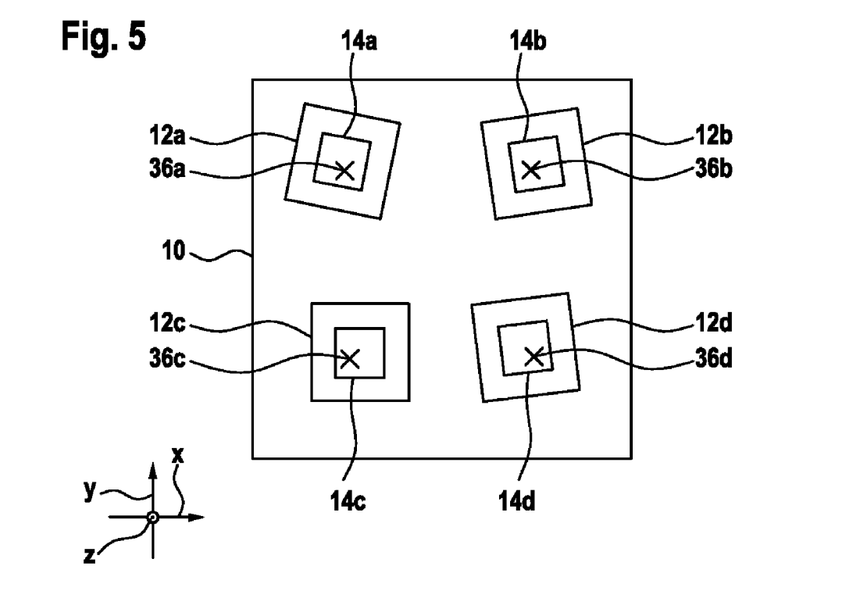
FIG. 5 is another schematic top view on a circuit board.

FIG. 5 is a diagram of a top view on the circuit board 10. In contrast to FIG. 4, the SMD semiconductor light sources 12*a* to 12*d* were not arranged, on the circuit board 10 rotated about the respective torsion angle 34, but the SMD semiconductor light sources 12*a* to 12*d* were placed only with their main light outputs 36 above the respective target coordinates 22 of the circuit board 10. The respective main light outputs 36 of the light profile 14 are basically not arranged concentrically to the respective outer edges of the light profile 14. This individual adjustment of the SMD semiconductor light source components 12a to 12d relative to the respective main light outputs ensures a specific target light distribution, because the main light outputs 36 are placed on the provided target coordinates 22. The respective target coordinates 22, for example, those shown in FIG. 4, are not depicted in FIG. 5 because the coordinates of the light output 36 and the respectively associated target coordinate 22 overlap. Because of the fact that, according to FIG. 5, the progression of the respective outer edges of a light profile 14 is not important but, instead, the placement of the main light output 36, the SMD semiconductor light source components 12 are shown arbitrarily distorted.

Figure 6:
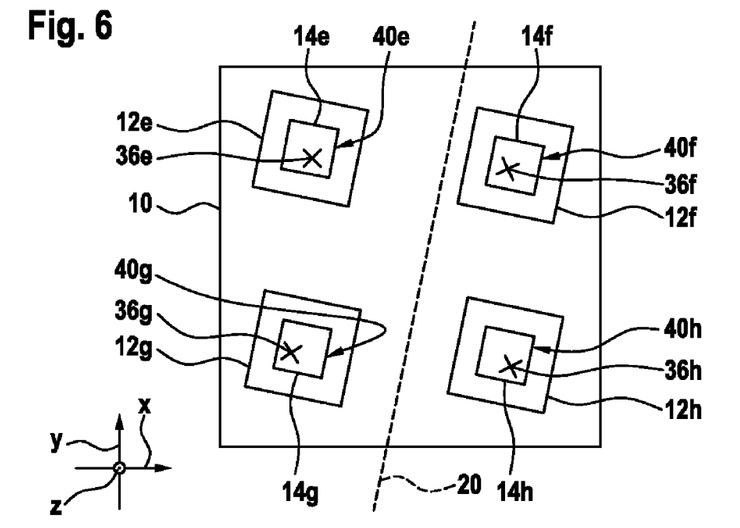
FIG. 6 is another schematic top view on a circuit board.

FIG. 6 is a schematic top view on the circuit board 10. The SMD semiconductor light source components 12e to 12h were placed with the respective edge 40 of the light profile 14 parallel to a straight 20. In addition, the SMD semiconductor light source components 12e to 12h were positioned with their main light outputs 36 above the respective target coordinates 22 and connected with the circuit board 10. Besides a desired light distribution regarding the main light outputs 36, it is possible to precisely define and maintain a limit of the emission, characteristics so as not to dazzle the other road users.

It is also possible to use an embodiment in which the light profile 40 comprises only the edge 40 and, correspondingly, an SMD semiconductor light source component 12 is positioned at its target position only rotated about a particular torsion angle and connected with the circuit board 10.

Figure 7:
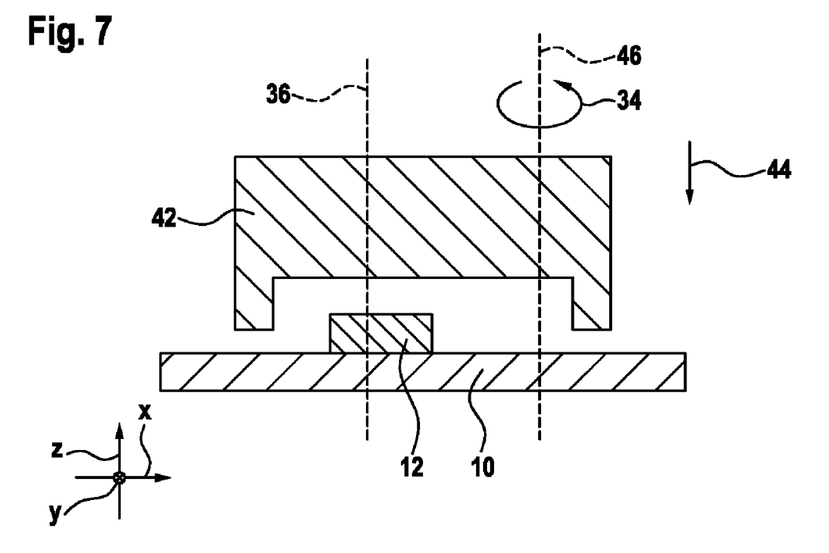
FIG. 7 shows a schematic sectional view in a production step.

FIG. 7 is a diagram of a sectional view through the circuit board 10, the SMD semiconductor light source component 12 and an optically effective component 42 in a production step. The optical component 42 is connected with the circuit board 10 so as to emit from the motor vehicle the light generated by the SMD semiconductor light source 12 in the form of a desired light distribution. In the production step shown in FIG. 7, the optical component 42 is connected with the circuit board 10 opposite to a x-direction according to arrow 44.

At this point, it should be mentioned that besides the electrical components, such as the circuit board 10, and the optical components 42, which can be designed in the form of an optical bead or screen, it is certainly also possible to use additional components, such as connection components. If such connection components are used in the methods described above, these connection: components are designed in such a way that the SMD semiconductor light source component 12 can be connected or adjusted by such connection components with the electrical, component in the form of a circuit board 10 and/or the optical component 42. Therefore, such connection components are designed to indirectly connect the SMD semiconductor light source component 12 with the electrical component 10 and/or the optical component 42. A connection of an SMD semiconductor light source component 12 with the circuit board 10 comprises the entire disclosure of a soldering process.

The optical component 42, in turn, is positioned in accordance with the drill holes 18. If the SMD semiconductor light source component 12 has been positioned relative to the circuit board 10 and connected with the circuit board according to methods presently proposed, the optical component 42 can be advantageously positioned at the target coordinate provided for the optical component 42 and connected with the circuit board 10 without rotation or coordinate displacement. For example, the optical component 41 can be connected with the circuit board by drill holes 18. This facilitates the placement of the optical component 42 and at the same time improves the precision of the image.

In FIG. 7, the light profile 14 of the SMD semiconductor light source 12 is used to directly adjust the optical component 42 relative to the circuit board 10 and the SMD semiconductor light source 12 and to connect the optical component 42 with the circuit board 10. It is certainly also possible to place connection components between the circuit board 10 and the optical component 42. The light profile 14 is determined by the edge 40 and/or the main light output 36, wherein the edge 40 and the main light output 36 do not have to be directly connected, which also allows for a movement about a different axis. As a result, the torsion angle 34, which is produced in accordance with the edge 40, can be rotated, for example, about a different coordinate 46.

Figure 8:
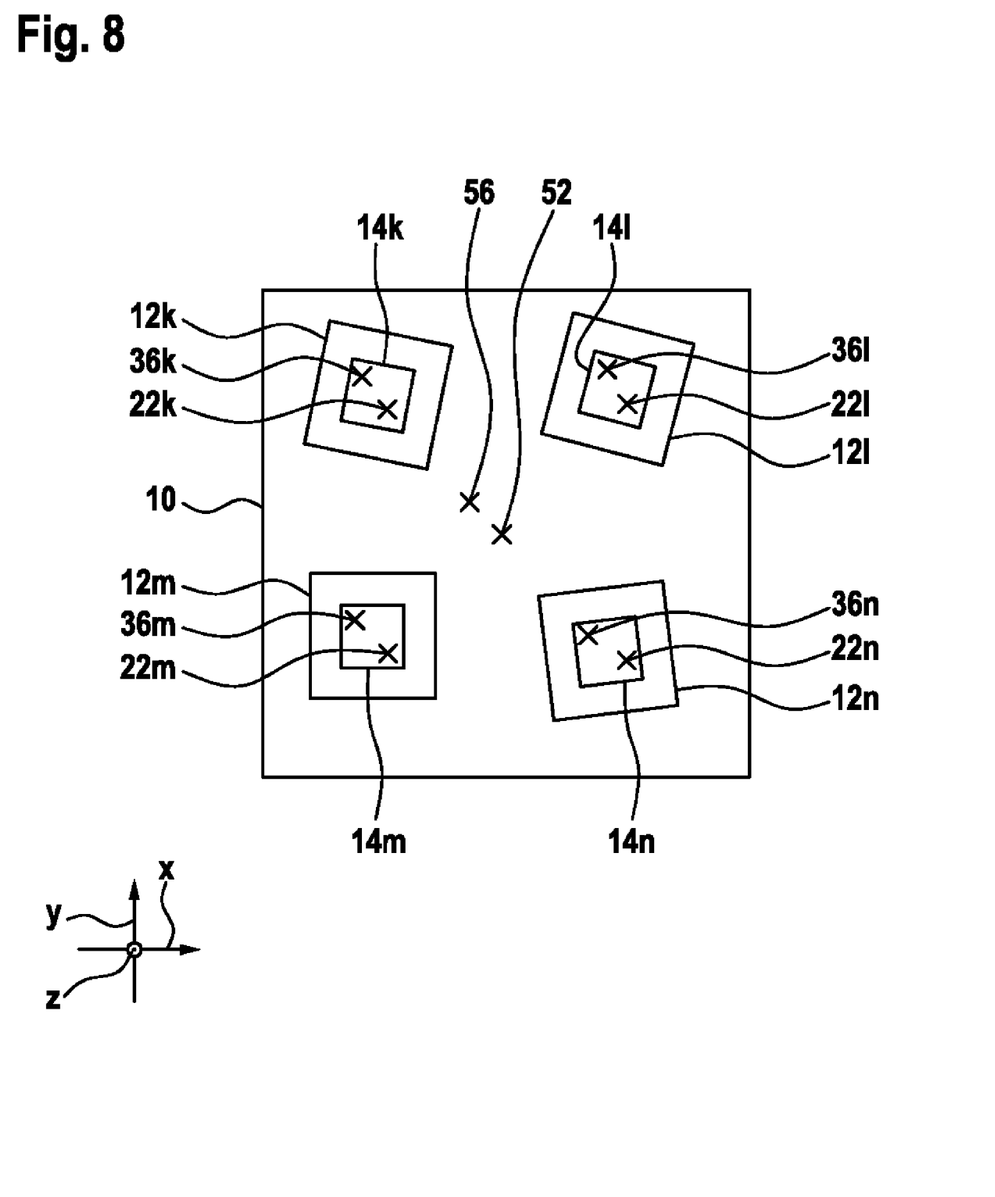
FIG. 8 is another schematic top view on a circuit board.

FIG. 8 is a diagram of a top view on the circuit board 10. In contrast to FIGS. 5 and 6, in FIG. 8 the SMD semiconductor light source components 12k to 12n have been already placed on the circuit board 10 and a mutual main light output 56 is determined. In terms of a center, the target coordinates 22k to 22n result in a mutual target coordinate 52. For example, it is possible to determine the mutual main light output 56 as center from the individual main, light outputs 36k to 36n. For example, just as FIGS. 5, 6 and 9, FIG. 8 represents part of a matrix headlight, in which the precision of the light distribution is improved.

Therefore, in FIG. 8, a mutual main light output 56 is produced, which deviates from the mutual target coordinate 52, and by use of the main light output 56 the optical component 42 can be displaced about a vector according to coordinates 52 and 56, just as in FIG. 7. Advantageously, this results in a light distribution to which the mutual main light output 56 is adjusted to the optical component 42. In addition, manufacturing tolerances of the SMD semiconductor light sources 12k to 12n, as well as manufacturing tolerances regarding an application of the SMD semiconductor light source components 12k to 12n on the circuit board 10 can be advantageously compensated.

Figure 9:
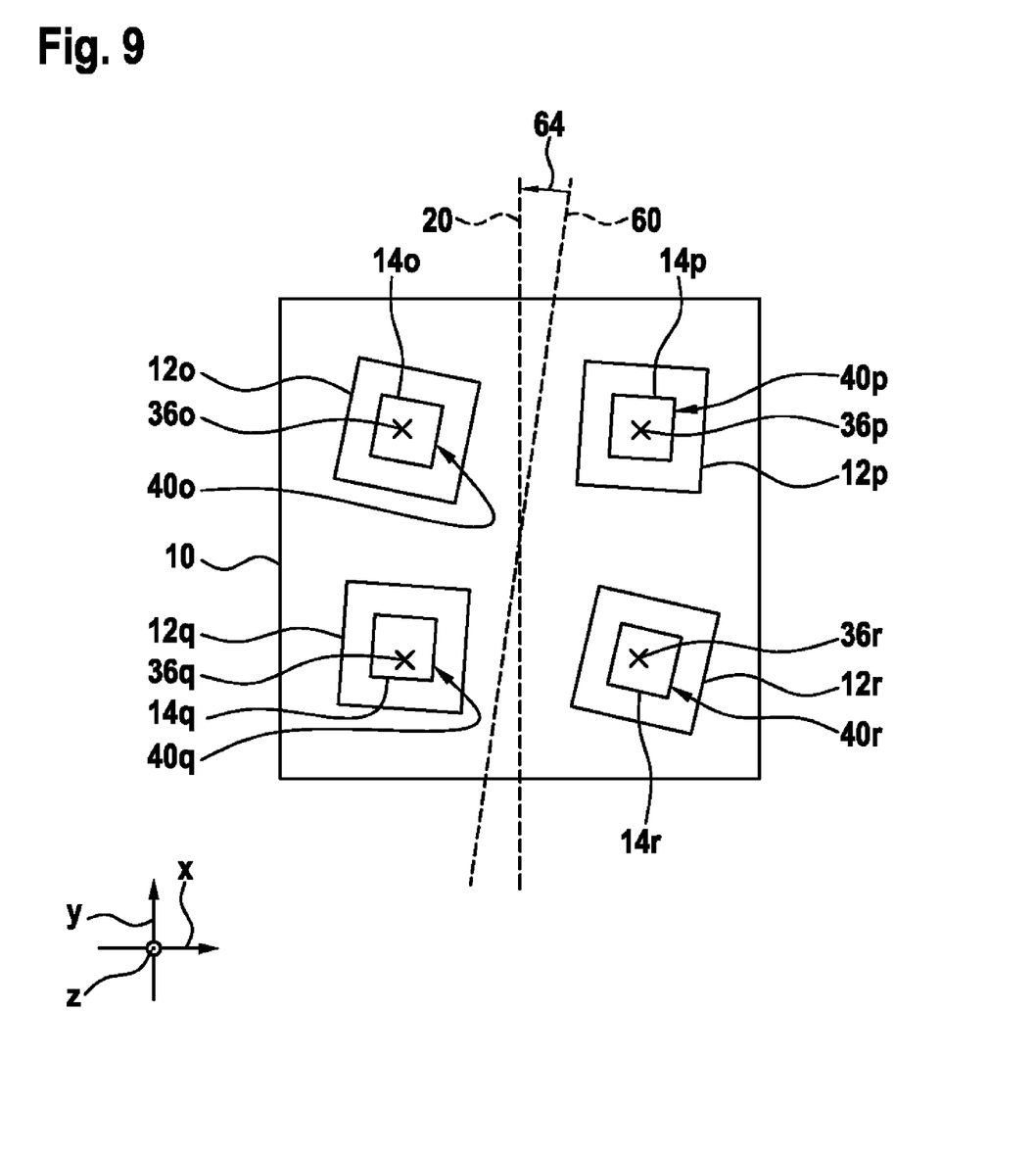
FIG. 9 is another schematic top view on a circuit board.

FIG. 9 is a diagram of a top view on the circuit board 10. Just as in FIG. 8, in FIG. 9 the SMD semiconductor light sources 12o to 12r have been already placed on the circuit, board 10 and connected with the circuit board 10. For example, it is possible to perform a method according to the first, second and third step prior to connecting the SMD semiconductor light sources 12o to 12r. For example, each of the SMD semiconductor light source components 12o to 12r was connected by the respective target coordinate 22 with the respective main light output 36 and connected with the circuit board 10.

Figure 10:
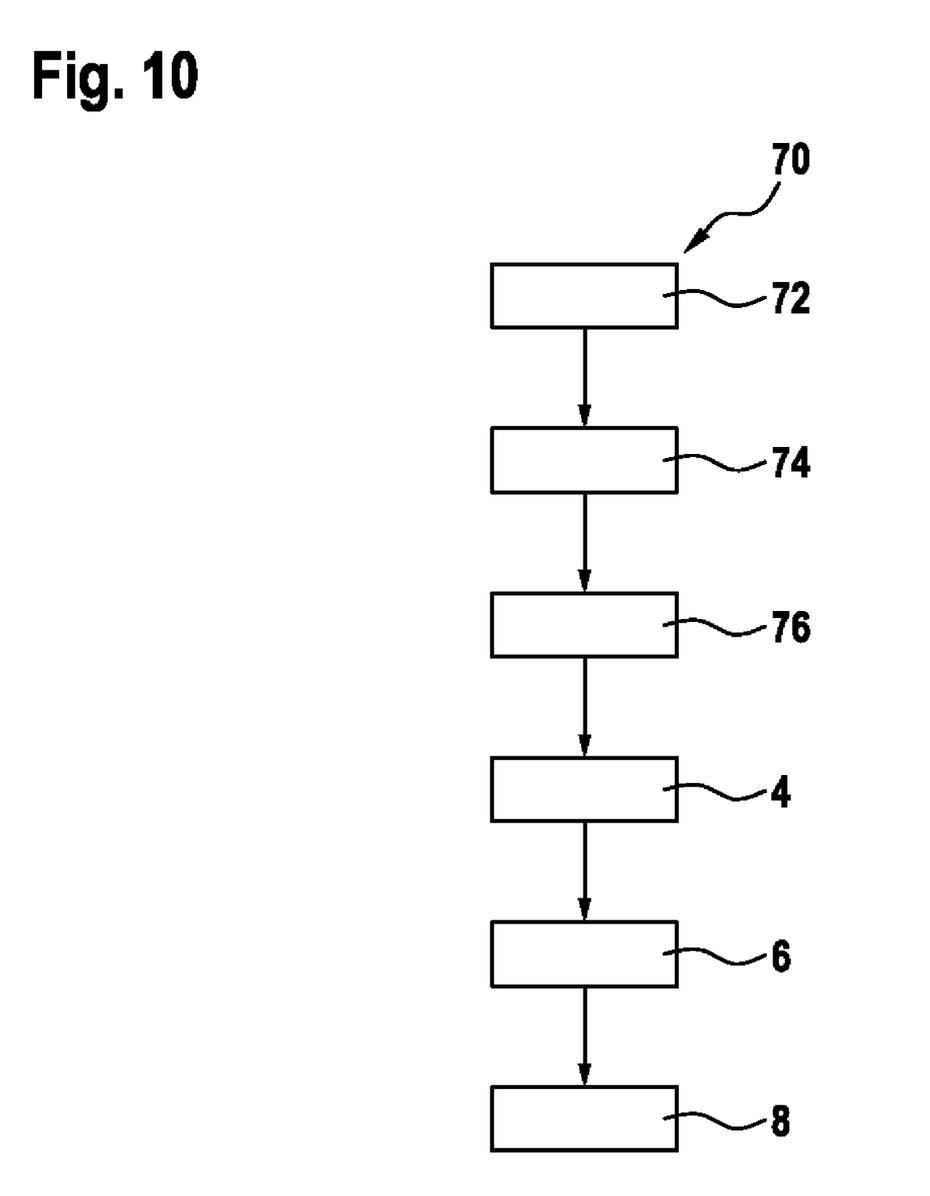
FIG. 10 is a schematic flow diagram.

In the method described in more detail in FIG. 10, a further image of the circuit board 10 with the SMD semiconductor light source components 12o to 12r placed upon it is recorded in accordance with FIG. 9. In consideration of the respective x-direction-oriented edges 40o to 40r of the respective SMD semiconductor light source components 12o to 12r of the respective light profiles 14, a straight 20 results in a mean mutual edge 60, and regarding the straight 20 a mutual torsion angle 64. By the mutual torsion angle 64, the optical component 42 and the circuit board 10 are subsequently positioned relative to one another rotated about the angle 42 and then connected with one another.

FIG. 10 shows a schematic flow diagram 70, which comprises the first step 4, the second step 6 and the third step 8 shown in FIG. 1. In a fourth step 72, the SMD semiconductor light source component is operated so as to generate light, wherein the SMD semiconductor light source component 12 is still positioned on a mounting arm or a deposit station and not yet connected with the circuit board 10. In a fifth step 74, a further light profile of the luminous SMD semiconductor light source component 12 is determined, in a sixth, step 76, the SMD semiconductor light source component 12 is positioned relative to the circuit board 10 in accordance with the determined further light profile and connected with the circuit, board 10. The fourth, fifth and sixth step 72,74, 76 are performed in this sequence prior to the first step 4.

The invention has been described in an illustrative manner. It is to be understood that the terminology which has been used is intended to be in the nature of words of description rather than of limitation. Many modifications and variations of the invention are possible in light of the above teachings. Therefore, within the scope of the appended claims, the invention may be practiced other than as specifically described.

The invention claimed is:

1. A method for placing at least one SMD semiconductor light source component and an optical component of an illumination device for a motor vehicle relative to one another, wherein the optical component is connected to a circuit board by centering holes, the method including the steps of: operating the at least one SMD semiconductor light source component so as to generate light, and determining emission characteristics of the at least one SMD semiconductor light source component, and positioning the at least one SMD semiconductor light source component and the optical component of the illumination device relative to one another in accordance with the emission characteristics, wherein a light profile is determined from the emission characteristics and relative to the circuit board, and wherein the at least one SMD semiconductor light source component and the optical component of the illumination device are positioned relative to one another in accordance with the determined light profile, and wherein the light profile is determined relative to the centering holes in the circuit board.

2. The method as set forth in claim 1, wherein the light profile of the at least one SMD semiconductor light source component comprises a main light output and/or an edge.

3. The method as set forth in claim 1, wherein the at least one SMD semiconductor light source component is placed on the circuit board, and wherein the at least one SMD semiconductor light source component is positioned in accordance with the determined light profile, and wherein the at least one SMD semiconductor light source component is connected in electrically conductive manner and integrally with the circuit board.

4. The method as set forth in claim 3, wherein the light profile is determined with respect to the at least one SMD semiconductor light source component, relative to an outer edge and/or relative to an outer edge of a light-emitting area.

5. The method as set forth in claim 3, the method comprising: attaching, with the use of an adhesive, of the at least one SMD semiconductor light source component relative to the circuit board, and providing the electrical and form-fit connection between the at least one SMD semiconductor light source component and the circuit board, formed using a reflow soldering process.

6. The method as set forth in claim 1, wherein the optical component of the illumination device comprises an optical component, having an optical head or a diaphragm.

7. The method as set forth in claim 6, wherein the at least one SMD semiconductor light source component is placed on a circuit board, wherein the circuit board and the optical component of the illumination device are positioned relative to one another and connected with one another.

8. The method as set forth in claim 7, wherein the at least one SMD semiconductor light source component is operated so as to generate light, wherein a further light profile of the luminous at least one SMD semiconductor light source component is determined, wherein the at least one SMD semiconductor light source component is positioned in relation to the circuit board and connected with the circuit board in accordance with the determined further light profile.

9. The method as set forth in claim 1, wherein the light profile of the at least one SMD semiconductor light source component is applied to the circuit board by encoding the circuit board.

10. The method as set forth in claim 1, wherein a plurality of SMD semiconductor light source components are operated and mutual emission characteristics are determined, wherein a mutual light profile of the plurality of SMD semiconductor light source components is determined.

11. The method as set forth in claim 1, wherein the light profile comprises a main light output, and wherein the main light output of the at least one SMD semiconductor light source component is basically positioned above a target coordinate on the electrical and/or optical component.

12. The method as set forth in claim 1, wherein the light profile comprises an edge, wherein in accordance with the edge and a target line a torsion angle for the at least one SMD semiconductor light source component is determined, and wherein the at least one SMD semiconductor light source component is positioned in distorted manner about the torsion angle relative to the electrical and/or optical component of the illumination device.

* * * * *

UNITED STATES PATENT AND TRADEMARK OFFICE
CERTIFICATE OF CORRECTION

PATENT NO. : 10,631,414 B2
APPLICATION NO. : 15/543652
DATED : April 21, 2020
INVENTOR(S) : Narcis Barqueros et al.

It is certified that error appears in the above-identified patent and that said Letters Patent is hereby corrected as shown below:

In the Claims

Column 12, Line 12 (Claim 6) delete "component, having" and insert therefor --component having--.

Signed and Sealed this
Third Day of November, 2020

Andrei Iancu
*Director of the United States Patent and Trademark Office*